US012772486B2

(12) United States Patent
Song et al.

(10) Patent No.: US 12,772,486 B2
(45) Date of Patent: Oct. 20, 2026

(54) GATE DIELECTRIC FEATURES IN HIGH-VOLTAGE IC DEVICES AND METHODS OF FORMING THE SAME

(71) Applicant: Taiwan Semiconductor Manufacturing Company, Ltd., Hsinchu (TW)

(72) Inventors: Jhu-Min Song, Nantou City (TW); Yi-Kai Ciou, Taoyuan City (TW); Chi-Te Lin, Hsinchu City (TW); Ying-Chou Chen, Taichung City (TW); Jiou-Kang Lee, Hsinchu (TW); Yi-Huan Chen, Hsinchu City (TW); Chien-Chih Chou, Taipei City (TW); Fei-Yun Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 383 days.

(21) Appl. No.: 18/457,417

(22) Filed: Aug. 29, 2023

(65) Prior Publication Data

US 2025/0081509 A1 Mar. 6, 2025

(51) Int. Cl.

*H10D 30/62* (2025.01)
*H10P 50/00* (2026.01)
*H10W 10/00* (2026.01)
*H10W 10/10* (2026.01)

(52) U.S. Cl.

CPC ............. *H10D 30/62* (2025.01); *H10P 50/73* (2026.01); *H10W 10/011* (2026.01); *H10W 10/10* (2026.01)

(58) Field of Classification Search

CPC .............................. H10D 30/62; H01L 21/762
See application file for complete search history.

(56) References Cited

U.S. PATENT DOCUMENTS

| | | | | |
|---|---|---|---|---|
| 9,847,399 | B1 * | 12/2017 | Lin | H10D 62/115 |
| 2010/0140687 | A1 * | 6/2010 | Chu | H10D 64/513 257/E27.026 |
| 2017/0194320 | A1 * | 7/2017 | Chen | H10D 64/516 |
| 2021/0078129 | A1 * | 3/2021 | Lin | B24B 37/015 |
| 2021/0226025 | A1 * | 7/2021 | Kung | H10D 30/63 |
| 2023/0197843 | A1 | 6/2023 | Yang et al. | |
| 2023/0326998 | A1 * | 10/2023 | Cai | H10D 64/518 257/369 |

* cited by examiner

*Primary Examiner* — Chad M Dicke
*Assistant Examiner* — Valerie N Newton
(74) *Attorney, Agent, or Firm* — Eschweiler & Potashnik, LLC

(57) ABSTRACT

Some embodiments relate to an integrated circuit device incorporating an etched recessed gate dielectric region. The integrated circuit device includes a substrate including a first upper surface, a gate dielectric region disposed at the first upper surface of the substrate and extending into the substrate, and a gate structure disposed over the gate dielectric region. The gate dielectric region includes a second upper surface and forms a recess extending below the second upper surface. The second upper surface includes a perimeter portion surrounding the recess. The gate structure completely covers the second upper surface of the gate dielectric region and extends into the recess.

20 Claims, 10 Drawing Sheets

GATE DIELECTRIC FEATURES IN HIGH-VOLTAGE IC DEVICES AND METHODS OF FORMING THE SAME

BACKGROUND

Mixed-signal integrated circuit (IC) devices incorporate both analog (e.g., high-voltage) circuitry and digital (e.g., logic) circuitry on the same IC die. Given various design and manufacturing constraints often imposed on circuitry of a particular IC device (e.g., dielectric layer depth, active region pattern density and layout, metal pattern density and layout, etc.), regardless of the particular type of circuitry used in the device, technical advances in one IC technology (e.g., high-voltage circuitry) may not be easily applicable to, or may adversely affect, another IC technology (e.g., logic circuitry) employed on the same die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
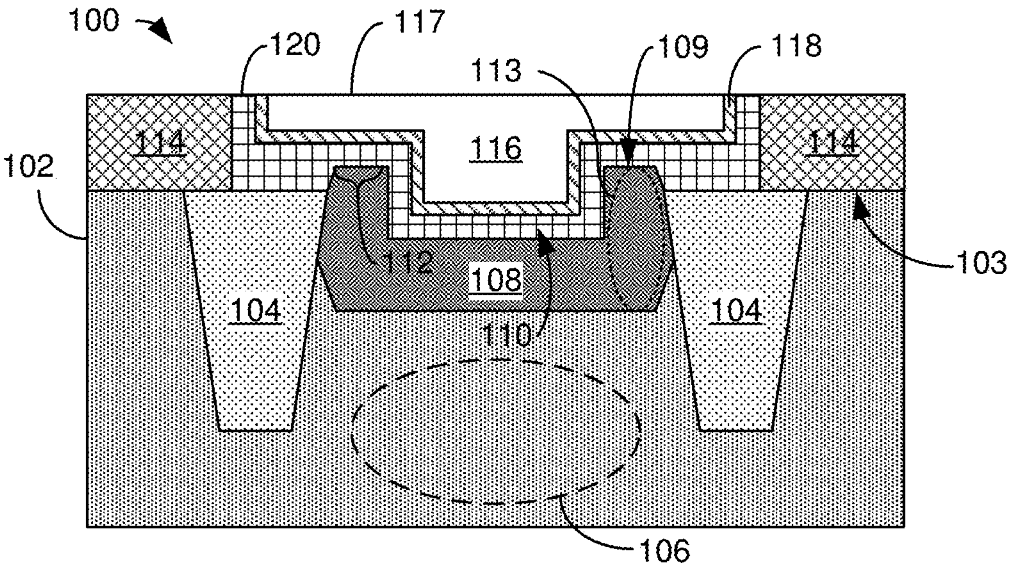
FIG. 1A illustrates a cross-sectional view of some embodiments of an IC device employing an etched recessed gate dielectric region, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Mixed-signal IC devices incorporating both high-voltage circuitry and logic circuitry on the same die are employed in a wide array of applications, such as interface or component drivers, image sensor processors, power management devices, and BCD (Bipolar-CMOS-DMOS) devices. Historically, a high-voltage circuit has sometimes included a relatively thick gate oxide region to render the gate compatible with high-voltage signals (e.g., by causing an increase in the resulting breakdown voltage of the gate oxide). Use of a thick gate oxide, however, necessitates formation of the corresponding gate conductor (e.g., metal, polycrystalline silicon, etc.) at a relatively high (vertical) position (e.g., closer to the overlying first metal (M1) layer). Consequently, employing a thick gate oxide may be problematic in some mixed-signal IC devices, particularly more advanced devices (e.g., devices associated with 28 nanometer (nm) or smaller technology nodes) in which thin interlayer dielectric (ILD) structures are used, as the resulting reduced distance between the gate conductor and the M1 layer may reduce the M1-to-gate breakdown voltage below an acceptable level while maintaining a satisfactory gate oxide breakdown voltage.

To address this issue, a recessed gate oxide region may be employed as an alternative to the use of a relatively thick gate oxide. For example, a substrate or other underlying layer may be etched to form a recess, and a gate oxide layer may then be grown to cover the recess and surrounding region of the substrate, followed by formation of the gate structure over the recessed gate oxide. In other embodiments, the gate oxide layer may be formed by way of a local oxidation of silicon (LOCOS) process. The resulting gate oxide region may thus provide a larger gate oxide breakdown voltage while maintaining a sufficient M1-to-gate distance.

However, either method discussed above (e.g., growth of the gate oxide over a recessed region of the substrate or direct oxidation of the substrate via LOCOS) often results in a reduced thickness of the gate oxide in the perimeter or "corner" region of the gate oxide that surrounds the recessed region. This reduced thickness is caused by the substrate in the corner region being incapable of providing enough silicon atoms during oxidation to provide a sufficiently thick oxide for the gate oxide in the corner region. This effect, in some examples, may ultimately cause an undesirable bimodal (e.g., "double-humped") subcritical drain current ($I_D$) versus gate voltage ($V_G$) characteristic curve (e.g., when applying a bias voltage ($V_{bs}$) less than or equal to −0.5 volts (V)), thus adversely affecting the performance of the associated transistor. This double-humped curve results from two threshold voltages ($V_t$) being created by the recessed gate oxide region: a first threshold voltage $V_{t1}$ associated with the corner region that is less than a separate second threshold voltage $V_{t2}$ associated with the recessed portion of the gate oxide region.

To address these issues, the present disclosure provides some embodiments of an IC device that includes an etched recessed gate dielectric region (e.g., an etched recessed gate oxide region). In some embodiments, a relatively thick gate dielectric is formed (e.g., grown) over a first upper surface of a substrate. In some embodiments, the first upper surface may include a substantially planar (e.g., non-recessed) region of the substrate. The gate dielectric is then etched to form a recessed gate dielectric region that does not exhibit thinning in the corner region of the structure, and thus does not generate a bimodal $I_D$ versus $V_G$ curve. Further, in some embodiments, the etching of the thick gate dielectric may be performed during an etching operation of an associated logic region of the IC device (e.g., by way of a logical operation on logic region mask data to add an opening in the mask for the gate dielectric recess lying outside the logic region), thus combining at least two actions during the manufacturing of the IC device, thereby decreasing the amount of time and other resources expended during IC fabrication. By forming the gate dielectric to a relatively large thickness that is greater than a typical high-voltage gate dielectric, thinning of the gate dielectric along outermost edges is avoided. Furthermore, by etching the gate dielectric to form a recessed gate dielectric region, the gate dielectric does not have a thickness that negatively affects performance of the device. Therefore, the disclosed gate dielectric region can avoid the double-humped curve without negatively impacting the performance of the resulting device.

FIG. 1A illustrates a cross-sectional view of some embodiments of an IC device 100 (e.g., a mixed-signal IC device) employing an etched recessed gate dielectric region, according to the present disclosure. IC device 100 may include a substrate 102 (e.g., a silicon substrate) having a first upper surface 103. A gate dielectric region 108 may be disposed at the first upper surface 103 of the substrate 102. In some embodiments, the gate dielectric region 108 may extend into the substrate 102. The gate dielectric region 108 may include a second upper surface 109 and may form a recess 110 extending below the second upper surface 109. In some embodiments, the second upper surface 109 includes a perimeter portion 112 surrounding the recess 110.

In some embodiments, a gate structure 116 may be disposed over the gate dielectric region 108. Also, in some embodiments, the gate structure 116 (e.g., a gate conductive material, such as polycrystalline silicon, metal, and/or another conductor) may completely cover the second upper surface 109 and extend into the recess 110 of the gate dielectric region 108. In some embodiments, the gate structure 116 may have an upper planar surface 117 that extends laterally beyond the gate dielectric region 108. In some embodiments, a diffusion barrier 120 (e.g., tantalum nitride (TaN)) may be disposed over the gate dielectric region 108 to isolate the gate structure 116 from the gate dielectric region 108. Additionally, in some embodiments, a transition layer 118 may form between the gate structure 116 and the diffusion barrier 120 (e.g., as a result of forming the gate structure 116).

In some embodiments, isolation regions 104 (e.g., shallow trench isolation (STI) regions including trenches filled with silicon dioxide ($SiO_2$) may be located laterally proximate the gate dielectric region 108. For example, isolation regions 104 may be disposed at opposing sides of the gate dielectric region 108 (e.g., to electrically isolate the IC device 100 from other portions of the substrate 102 being employed for other semiconductor components). Further, in some embodiments, one or more doped regions (not shown in FIG. 1A) may be disposed in the substrate 102 near the gate dielectric region 108 as part of a transistor or other semiconductor component of the IC device 100. During operation, the doped regions may cause a channel region 106 to form in the substrate 102 under the gate dielectric region 108.

Additionally, in some embodiments, a dielectric layer 114 (e.g., $SiO_2$), such as an interlayer dielectric (ILD), may be disposed over the substrate 102 laterally proximate the gate structure 116 and/or the diffusion barrier 120, and may extend at least partially over the one or more isolation regions 104. Accordingly, in some embodiments, the diffusion barrier 120 may isolate the gate structure 116 from the gate dielectric region 108, the one or more isolation regions 104, and the dielectric layer 114.

In some embodiments, as a result of etching the recess 110 after forming the gate dielectric region 108 (as opposed to etching the substrate 102 first and then forming the gate dielectric region 108 thereafter), the gate dielectric region 108 will not exhibit a thinned corner region (e.g., at corner regions 113 of FIG. 1) or the corresponding bimodal $I_D$ versus $V_G$ characteristic curve associated with other recessed gate dielectric regions, as discussed above. Instead, the forming of the gate dielectric region 108 prior to the etching operation may facilitate a sufficiently wide perimeter portion 112 to prevent the bimodal characteristic curve. Moreover, in some embodiments, as discussed in greater detail below, the recess 110 of the gate dielectric region 108 may be etched at the same time as other dielectric structures (e.g., in a logic region of the IC device 100) by way of a process integration in which a single mask and associated process action are employed.

While a single gate dielectric region 108 and associated gate structure 116 are discussed above and below, IC device 100 may be include several or many such structures in other embodiments.

Figure 1B:
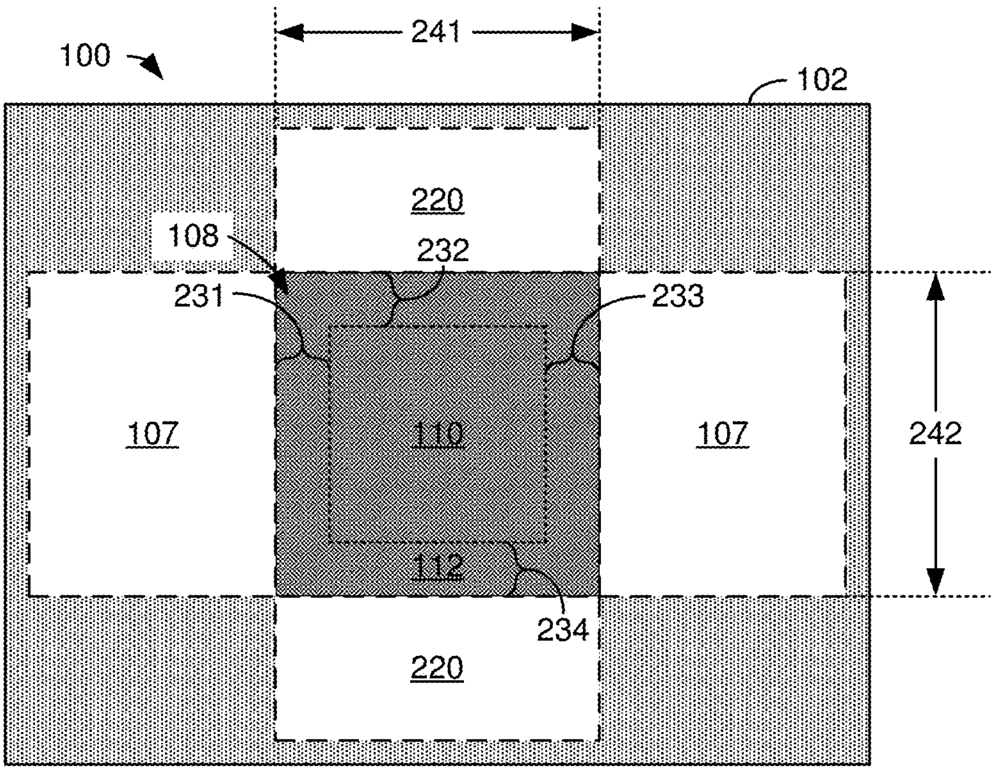
FIG. 1B illustrates a plan view of some embodiments of an IC device employing an etched recessed gate dielectric region, according to the present disclosure.

FIG. 1B illustrates a plan view of some embodiments of an IC device 100 employing an etched recessed gate dielectric region 108, according to the present disclosure. As depicted, FIG. 2 does not represent a strictly cross-sectional plan view, but instead illustrates a plan view of various features of the gate dielectric region 108 relative to the substrate 102, source/drain regions 107, and connections structures 220 of the IC device 100. In some embodiments, the source/drain regions 107 of the substrate 102 may generally be aligned leftward-and-rightward in FIG. 1B, while the connection structures 220 (e.g., polycrystalline silicon structures) disposed over the substrate 102 may be generally aligned upward-and-downward in FIG. 1B. In some embodiments, the connection structures 220 may include one or more metal structures (e.g., metal structures within a first metal layer "M1"). Consequently, in some embodiments, the source/drain regions 107 and the connection structures 220 may extend laterally parallel to the first upper surface 103 of the substrate 102 and perpendicular to each other, as shown in FIG. 1B.

In some embodiments, as shown in the plan view of FIG. 1B, the gate dielectric region 108 may be positioned at an intersection of the source/drain regions 107 and the connection structures 220. Also, in some embodiments, a first lateral dimension 241 of the gate dielectric region 108 may substantially match the corresponding lateral dimension of the connection structures 220, and a second lateral dimension 242 of the gate dielectric region 108 may substantially match the corresponding lateral dimension of the source/drain regions 107. In some embodiments, the first lateral dimension 241 and the second lateral dimension 242 may or may not be equal. In some embodiments, each of the first lateral dimension 241 and the second lateral dimension 242 may be greater than or equal to approximately 0.36 microns (μm), greater than or equal to approximately 0.5 μm, or other similar values.

Figure 2:
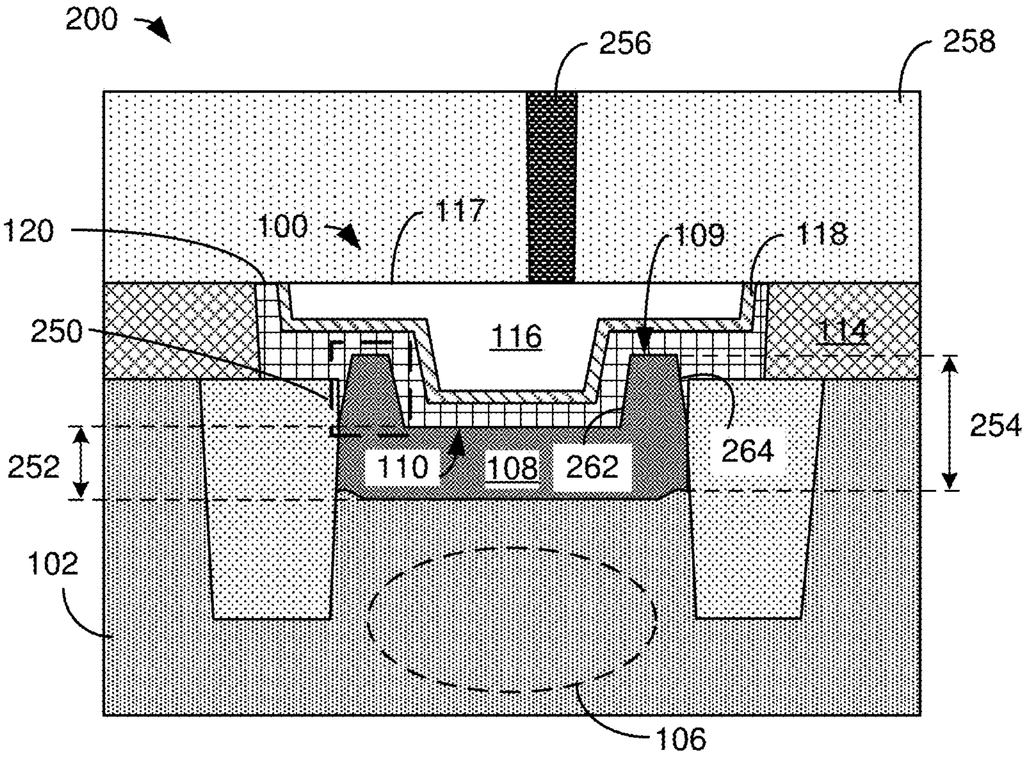
FIG. 2 illustrates a cross-sectional view of some additional embodiments of an IC device employing an etched recessed gate dielectric region, according to the present disclosure.

In some embodiments, the recess 110 of the gate dielectric region 108 may have a rectangular (e.g., square) shape in the plan view of FIG. 2, although other shapes (e.g., a rounded rectangular shape, a circular shape, etc.) are possible. Further, in some embodiments, the perimeter portion 112 surrounding the recess 110 may appear as a rectangular (e.g., square) border or frame, in which each of four linear segments of the perimeter portion 112 may have a corresponding first width 231, second width 232, third width 233, and fourth width 234. In some embodiments, each width 231-234 of the perimeter portion 112 may or may not be equal to each other. Also, in some embodiments, each width 231-234 of the perimeter portion 112 may be in a range of approximately 0.04 μm to approximately 0.1 μm, in a range of approximately 0.06 μm to approximately 0.08 μm, or other similar ranges.

FIG. 2 illustrates a cross-sectional view of some additional embodiments of an IC device 200 employing an etched recessed gate dielectric region, according to the present disclosure.

The IC device 200 includes a gate dielectric region 108 disposed over a substrate 102 and laterally between isolation regions 104 between sidewalls of the substrate 102. The gate dielectric region 108 includes a lower surface that contacts the substrate 102. Outermost edges of the lower surface are coupled to angled surfaces that cause the gate dielectric region 108 to slope upward along opposing outermost lower edges of the gate dielectric region 108. In some embodiments, the angled surfaces may comprise curved surfaces.

The gate dielectric region 108 may include interior sidewalls 262 that form a recess 110 extending into a second upper surface 109 of the gate dielectric region 108. The recess 110 is arranged within a central region of the gate dielectric region 108, which is surrounded by a peripheral region of the gate dielectric region 108. In some embodiments, the interior sidewalls 262 and outermost sidewalls 264 of the gate dielectric region 108 may slope toward each other so as to form a trapezoidal shaped upper portion 250 of the peripheral region. The recess 110 reduces a thickness of the central region of the gate dielectric region 108 so that the gate dielectric region has a first thickness 252 within the central region and a second thickness 254 along an outermost edge facing the isolation regions 104. In some embodiments, the second thickness 254 may be greater than or equal to the first thickness 252. In some embodiments, the second thickness 254 may be greater than the first thickness 252 by an amount ranging from approximately 2 nm to 3 nm.

A gate structure 116 is arranged over the gate dielectric region 108. The gate structure 116 may be separated from the gate dielectric region 108 by a diffusion barrier 120. In some embodiments, the diffusion barrier 120 may extend from over the top of the gate dielectric region 108 to directly between the outermost sidewalls of the gate dielectric region 108 and sidewalls of the isolation regions 104.

An upper dielectric structure 258 is disposed over the gate structure 116. An interconnect 256 extends through the upper dielectric structure 258 to contact the gate structure 116. In some embodiments, the interconnect 256 may include an interconnect contact or an interconnect via.

In some embodiments, the enhanced second thickness 254 of the peripheral region of the gate dielectric region 108 may result in a reduction of the two threshold voltages of the subcritical $I_D$ versus $V_G$ characteristic curve discussed above to a single threshold voltage, thus eliminating the bimodal nature of the curve, resulting in improved transistor performance.

FIGS. 3-14 illustrate cross-sectional views of some embodiments of a semiconductor structure for an IC device 100 employing an etched recessed gate dielectric region at various stages of manufacture. In addition, FIGS. 12A and 12B illustrate cross-sectional views of some embodiments of a semiconductor structure for a mixed-signal IC device (e.g., IC device 100) employing an etched recessed gate dielectric region at a particular stage of manufacture. Although FIGS. 3-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 3:
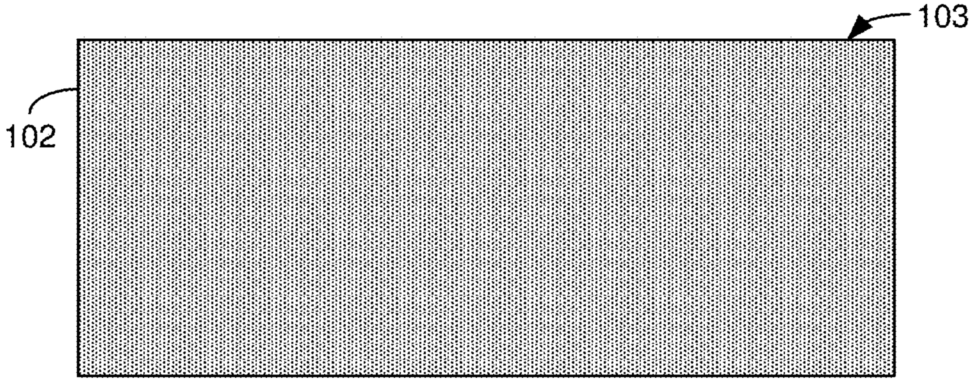
FIGS. 3-14 illustrate cross-sectional views of some embodiments of a semiconductor structure for an IC device employing an etched recessed gate dielectric region at various stages of manufacture.

FIG. 3 illustrates a portion of the substrate 102 that may serve as the base structure upon which additional processing acts, as depicted in FIGS. 4-14, may be performed. The substrate 102 may be a p-doped silicon (p-Si) substrate, although other materials may be employed in other embodiments. Further, the substrate 102 may have a first upper surface 103 by or through which at least some of the processing acts illustrated in FIGS. 4-14 may be performed. Also, in some embodiments, the substrate 102 manifests as a semiconductor wafer. After processing is completed (e.g., as described below in connection with FIGS. 4-14), such a wafer may be optionally stacked with other wafers and then singulated into individual dice that correspond to individual IC devices 100.

Figure 4:
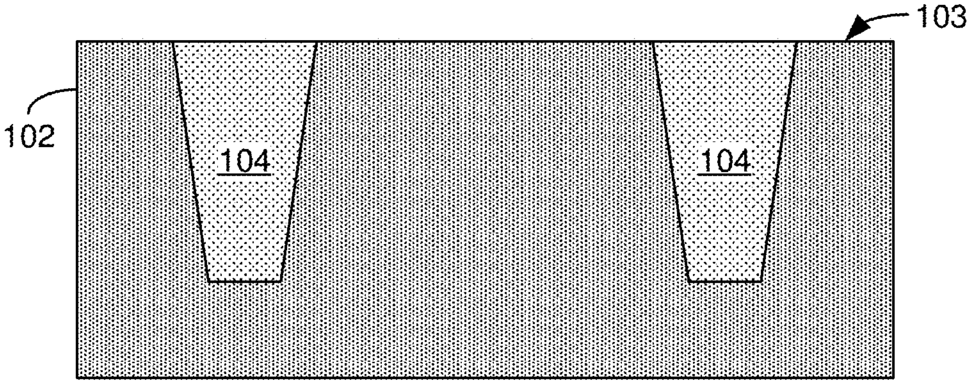

FIG. 4 illustrates creation of at least one isolation region 104. In some embodiments, the at least one isolation region 104 may be formed by etching the substrate 102 and subsequently filling the resulting trenches with material forming the at least one isolation region 104. In some embodiments, the at least one isolation region 104 may include a dielectric (e.g., silicon dioxide ($SiO_2$), silicon nitride ($Si_3N_4$), or the like). While more than one isolation region 104 is indicated in the cross-sectional view of FIG. 4, two or more of the isolation regions 104 may be interconnected to form a single isolation region 104. In some embodiments, the at least one isolation region 104, in operation, may limit or prevent leakage current therethrough. Moreover, the forming of the at least one isolation region 104 may be followed by chemical-mechanical planarization (CMP) of the corresponding surface (e.g., first upper surface 103 surface) of the substrate 102 that includes the at least one isolation region 104. After the creation of the isolation regions 104, one or more active (e.g., doped) regions (not shown in FIG. 4) may be formed within the substrate 102 via the first upper surface 103 (e.g., after the formation of the at least one isolation region 104). As used herein, a doped (or active) region may be any active semiconductor region of the substrate 102, such as doped n-regions or p-regions for transistor sources and drains. Further, during operation, as a result of the doped regions, one or more channels (e.g., channel region 106 of FIG. 1) may form.

Figure 5:
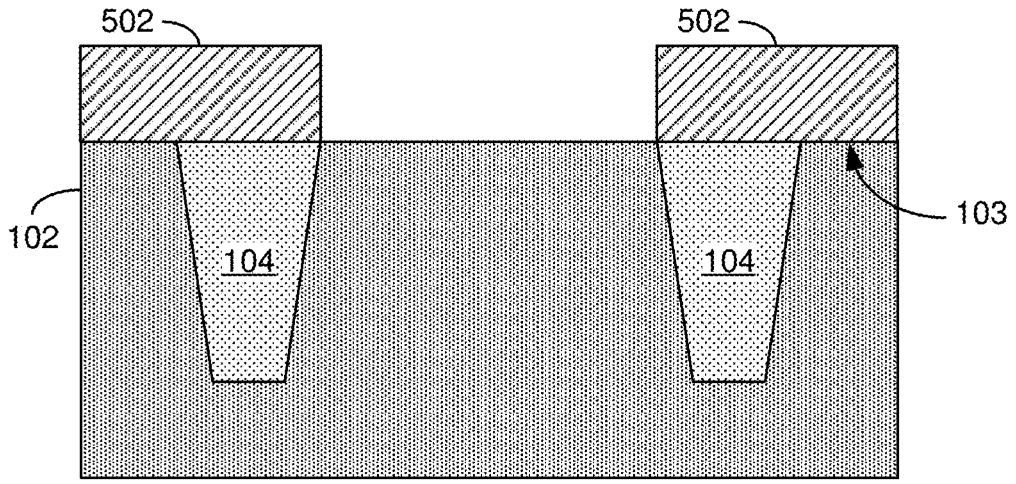

FIG. 5 illustrates formation of a barrier structure 502 (e.g., silicon nitride (SiN)) over one or more portions of the first upper surface 103 of the substrate 102. In some embodiments, the barrier structure 502 may be employed as a sacrificial chemical barrier to isolate portions of the substrate 102 from subsequent operations performed thereafter. More specifically, in some embodiments, portions of the first upper surface 103 of the substrate 102 (e.g., including the one or more isolation regions 104) may be covered with the barrier structure 502 while allowing an area allocated for the gate dielectric region (e.g., gate dielectric region 108 of FIG. 7) to remain exposed. In some embodiments, the entire first upper surface 103 may be covered with the barrier structure 502, followed by selective removal (e.g., via etching, lift-off processing, or the like) of portions of the barrier structure 502 to expose the area allocated for the gate dielectric region 108.

Figure 6:
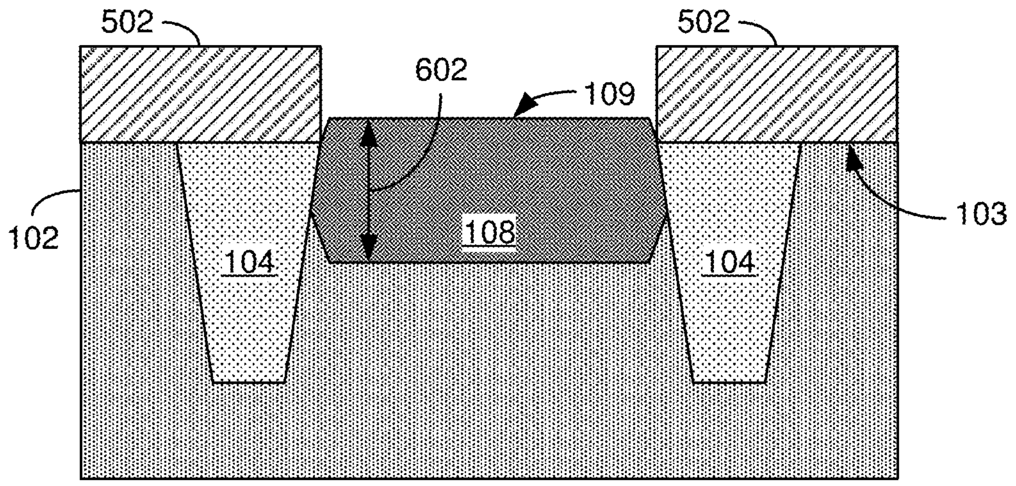

FIG. 6 illustrates formation of the gate dielectric region 108 at the first upper surface 103 of the substrate (e.g., between the one or more isolation regions 104) and extending into the substrate 102. In some embodiments, the portion of the first upper surface 103 at which the gate dielectric region 108 is formed is substantially planar to facilitate a generally planar second upper surface 109 for the gate dielectric region 108. In some embodiments, the gate dielectric region 108 may be grown at the first upper surface 103 of the substrate 102 by one or more oxidation processes, including wet (e.g., oxygen plus water vapor) and/or dry (e.g., oxygen only) oxidation techniques. As a result of the one or more oxidation processes, the gate dielectric region 108 may attain a thickness 602 sufficient to be subsequently etched while remaining capable of withstanding expected high-level gate voltages (e.g., 4 V to 35 V, depending on the particular application). Additionally, in some embodiments, a majority of the thickness 602 of the gate dielectric region 108 may extend downward into the substrate 102 (e.g., below the first upper surface 103).

In some embodiments, to grow the gate dielectric region 108, a wet thermal oxidation temperature of 900 to 950 degrees Celsius (° C.) may be used. At such temperatures, in some examples, an oxidation processing time of 50 to 70 minutes may yield a thickness 602 of 250 to 300 angstroms (A), which may be appropriate for a maximum expected gate voltage of 4 to 8 V. In other examples, an oxidation processing time of 200 to 240 minutes at the above-cited temperatures may yield a thickness 602 of 1000 to 1200 A, which may be appropriate for a maximum expected gate voltage of 20 to 35 V. Other combinations of oxidation temperature and processing time may yield different thicknesses 602 according to the needs of the particular application for the IC device 100. In some embodiments, the thickness 602, corresponding to the second thickness 254 of the peripheral region shown in FIG. 2, may be positively related to a maximum expected gate voltage across the gate dielectric region.

Figure 7:
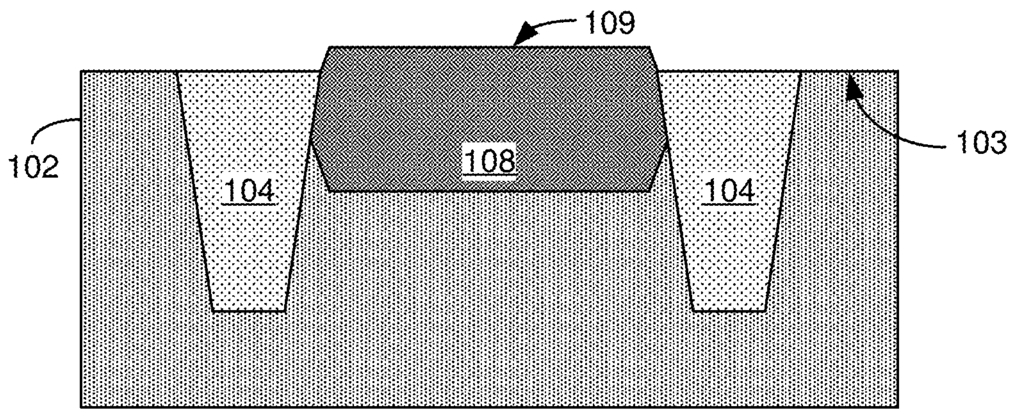

FIG. 7 illustrates removal of the barrier structure 502 from the first upper surface 103 of the substrate 102, thus leaving the associated portions of first upper surface 103 exposed for further processing. In some embodiments, removal of the barrier structure 502 may involve the application and subsequent rinsing of a chemical solution or agent (e.g., a solvent) that removes the barrier structure 502 without affecting the remaining structures, such as the one or more isolation regions 104 and the first upper surface 103 of the substrate 102.

Figure 8:
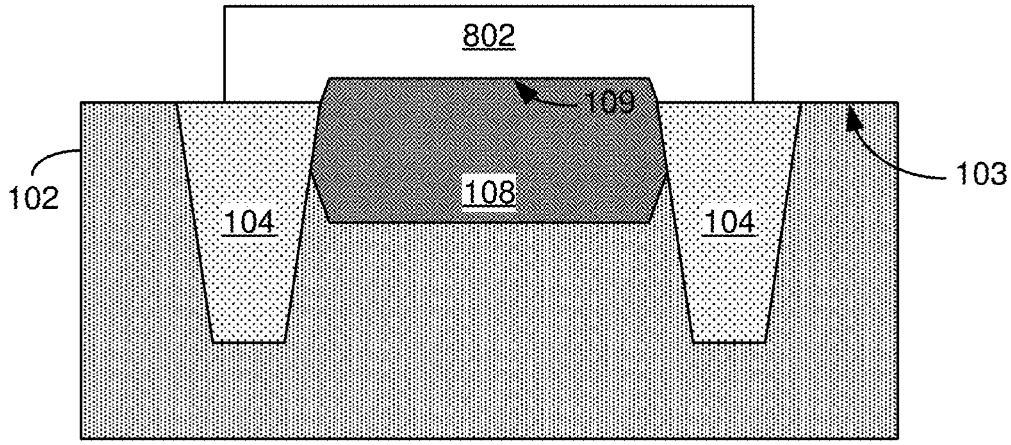

FIG. 8 illustrates formation (e.g., deposition and subsequent selective removal) of a sacrificial structure 802 (e.g., a polycrystalline silicon structure) over an entirety of the second upper surface 109 of the gate dielectric region 108, and possibly further extending laterally (e.g., over a portion of the one or more isolation regions 104). In some embodiments, the sacrificial structure 802 may be deposited over an entirety of the first upper surface 103 of the substrate 102 and the gate dielectric region 108, and then patterned (e.g., via etching, lift-off processing, or other processing) for selective removal of various portions of the sacrificial structure 802, such as those not overlying the gate dielectric region 108.

Figure 9:
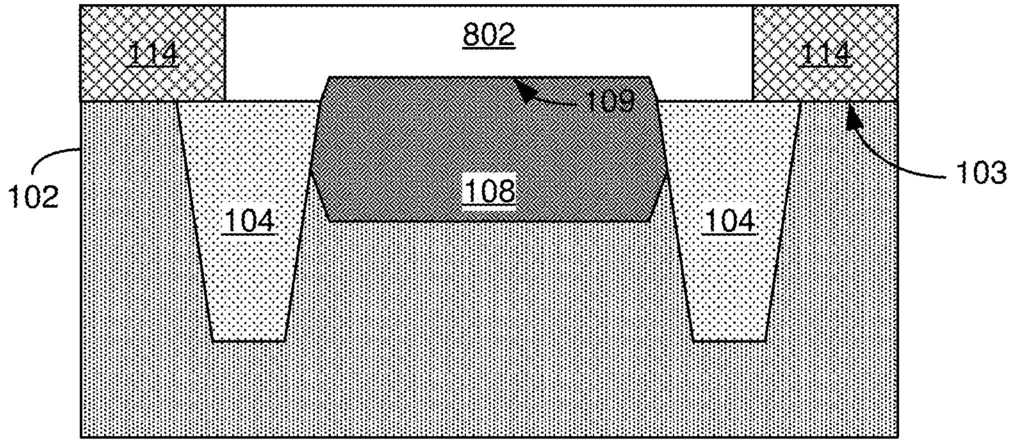

FIG. 9 illustrates formation (e.g., deposition) of the dielectric layer 114 (e.g., $SiO_2$) over portions of the substrate 102 not occupied by the sacrificial structure 802. In some embodiments, such formation results in the filling of areas of the substrate 102 not occupied by the sacrificial structure 802. In some embodiments, the dielectric layer 114 may be referred to as interlayer dielectric zero (ILD0) for being the first of one or more ILDs to be formed over the substrate 102. Thereafter, in some embodiments, the upper surfaces of the dielectric layer 114 and the sacrificial structure 802 may be planarized (e.g., by way of chemical-mechanical planarization (CMP)).

Figure 10:
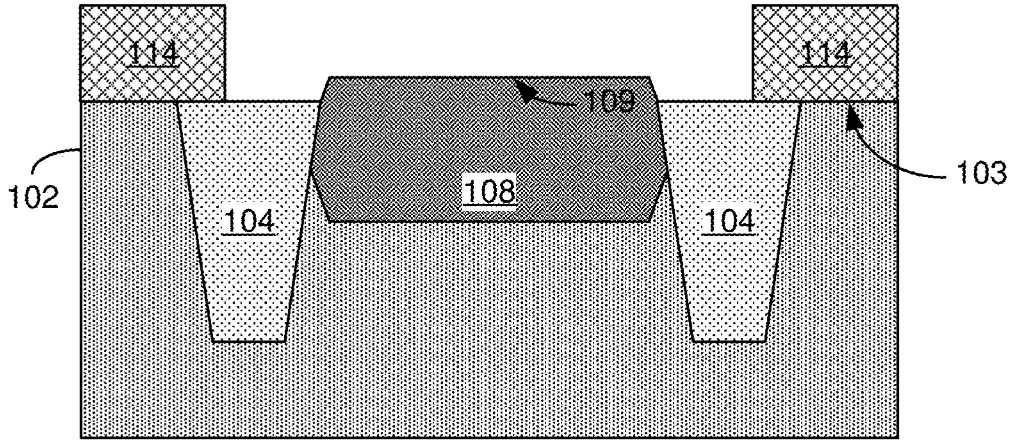

FIG. 10 illustrates removal of the sacrificial structure 802 from the first upper surface 103 of the substrate 102 and the second upper surface 109 of the gate dielectric region 108. This removal, in some embodiments, may be accomplished by way of a lithographic process, an etching process, a lift-off process, and/or the like. In other embodiments, the removal of the sacrificial structure 802 may be accomplished by way of the application and subsequent rinsing of a chemical solution or agent (e.g., a solvent) that removes the sacrificial structure 802 without affecting the remaining structures, such as the dielectric layer 114, the one or more isolation regions 104, and the gate dielectric region 108.

Figure 11:
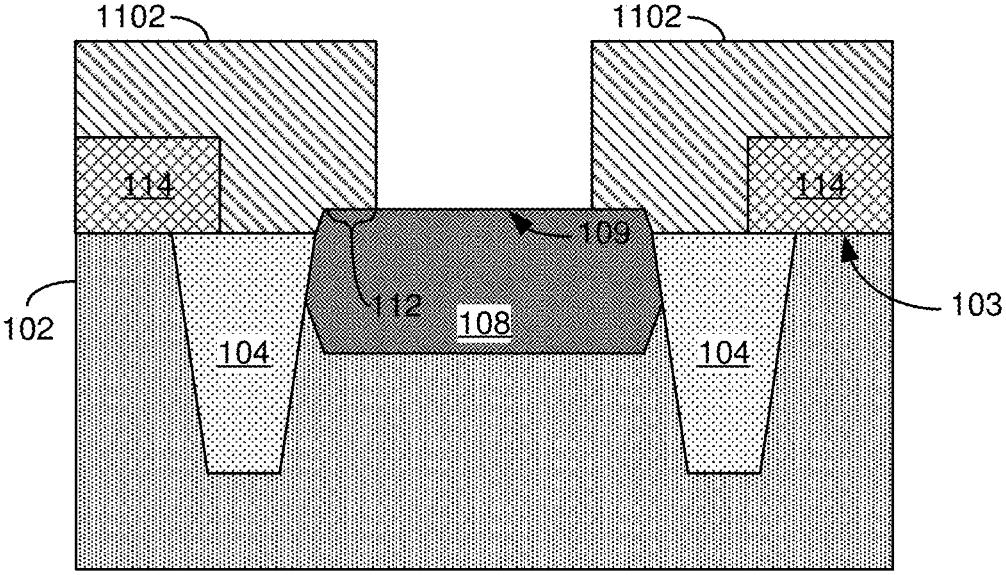

FIG. 11 illustrates selective formation (e.g., deposition and patterning) of a masking layer 1102 (e.g., a photoresist layer, a hard mask layer, and/or the like). In some embodiments, the masking layer 1102 may comprise a photoresist layer that is deposited onto the structure depicted in FIG. 11, and then selectively patterned by way of a mask (not shown in FIG. 12). In some embodiments, the masking layer 1102 may be a positive photoresist that becomes more soluble when irradiated with ultraviolet (UV) light (e.g., facilitated by holes or windows in the mask). In such embodiments, the portion of the masking layer 1102 formed over the portion of the gate dielectric region 108 to be subsequently etched may be irradiated and subsequently removed by way of a solvent. Accordingly, in some embodiments, the remaining portion of the masking layer 1102 covers the perimeter portion 112 of the gate dielectric region 108, as well as the at least one isolation region 104 and the dielectric layer 114.

Figure 12:
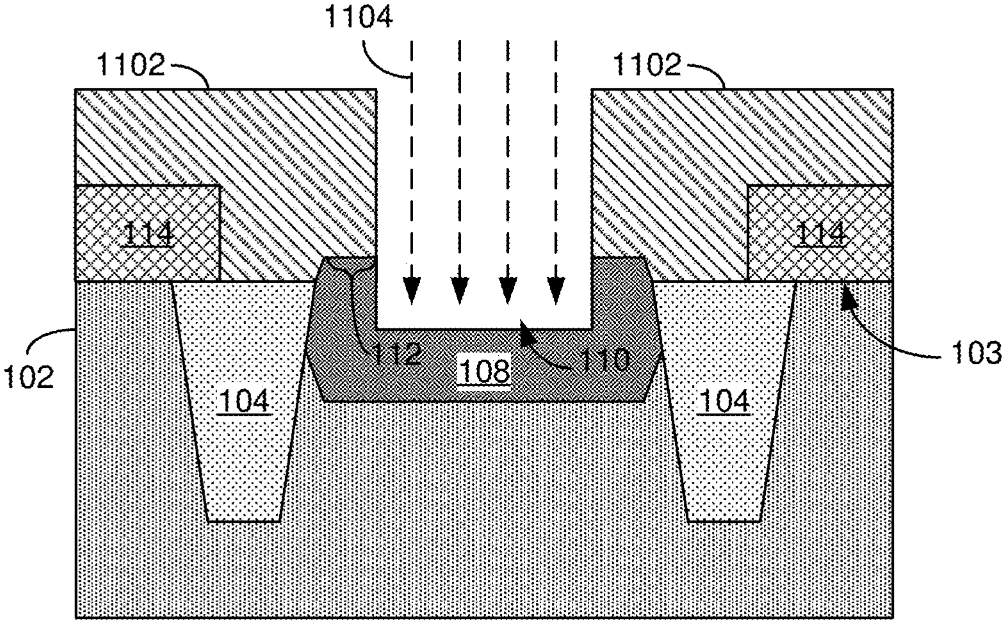
Figure 12A:
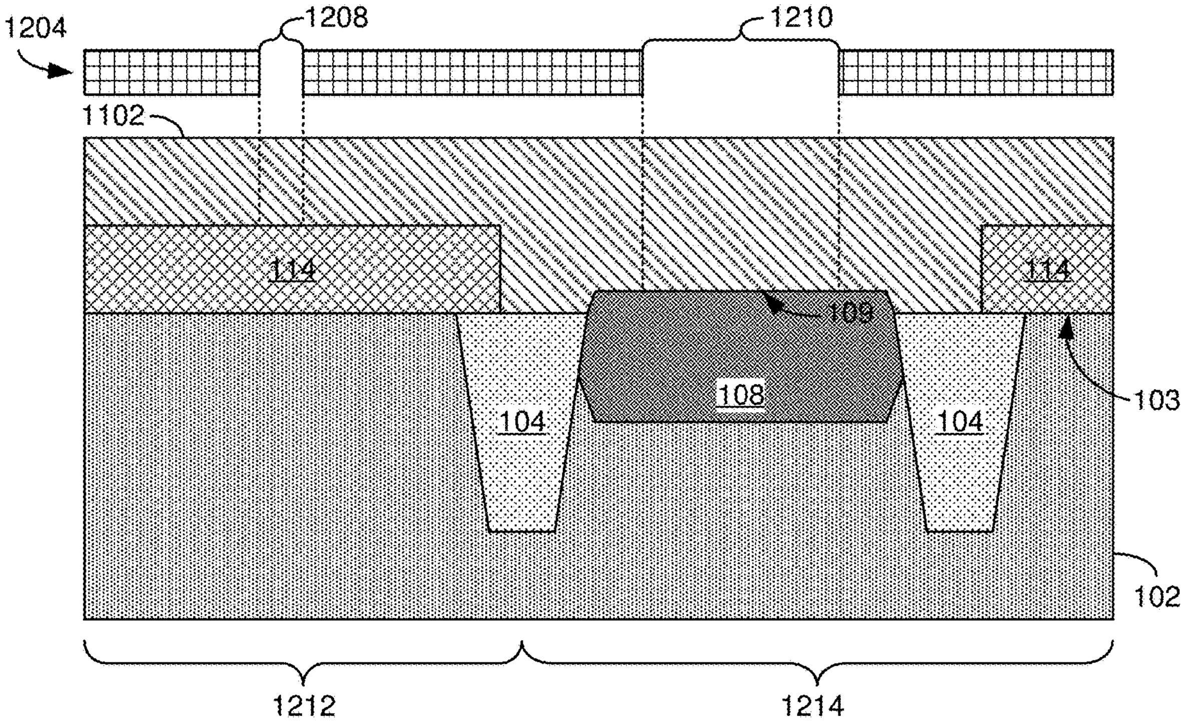
FIGS. 12A and 12B illustrate cross-sectional views of some embodiments of a semiconductor structure for a mixed-signal IC device employing an etched recessed gate dielectric region 108 at particular stages of manufacture.
Figure 12B:
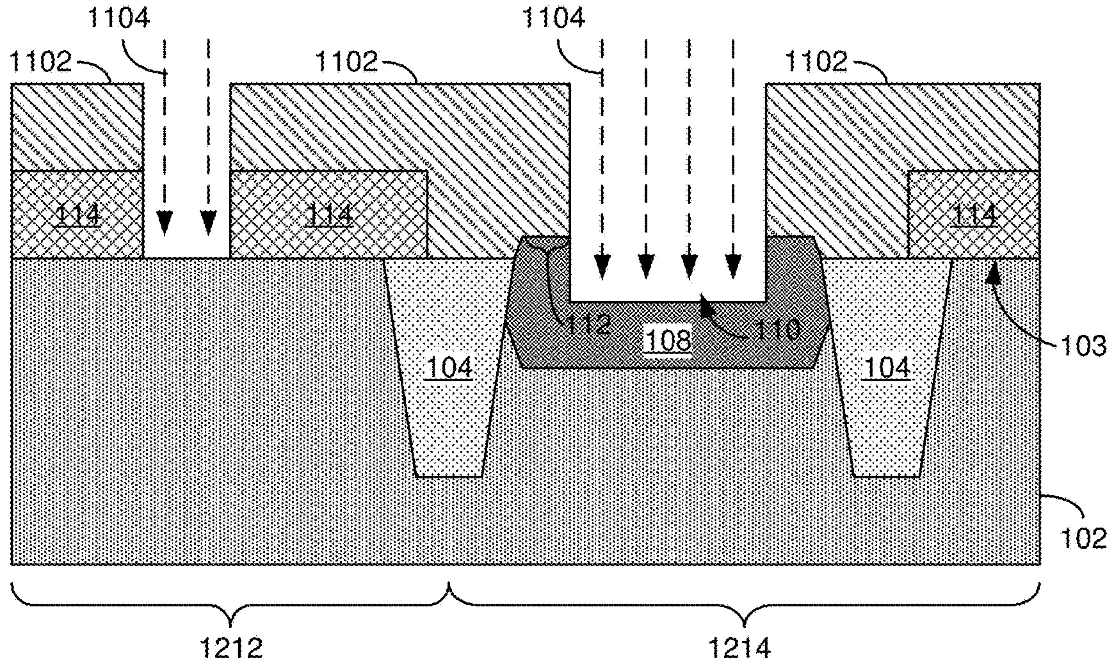

FIG. 12 illustrates formation (e.g., etching) of the recess 110 of the gate dielectric region 108. In some embodiments, the etching is performed by way of a dry or wet etchant 1104 to remove the exposed portion of the gate dielectric region 108 (e.g., the portion of the gate dielectric region 108 inside the perimeter portion 112) to form the recess 110. In some embodiments, the resulting recess 110 may extend below the level of the first upper surface 103 of the substrate 102 and/or may extend more than halfway through the thickness of the gate dielectric region 108. Etching the gate dielectric region 108 in such a manner reduces or eliminates the possibility of thinning of the corner region 113 (indicated in FIG. 1) of the gate dielectric region 108 that may otherwise produce a bimodal $I_D$ versus $V_G$ characteristic curve, as discussed above, thus improving the performance of the gate dielectric region 108. For example, even though the gate dielectric region 108 has angled lower corners that cause the outer edges of the gate dielectric region 108 to extend into the substrate 102 to a shallower depth than a central region of the gate dielectric region 108, the gate dielectric region 108 is formed to a sufficient thickness such that the angled lower corners will not be thin enough to cause an undesirable bimodal (e.g., "double-humped") subcritical drain current ($I_D$) versus gate voltage ($V_G$) characteristic curve.

FIGS. 12A and 12B illustrate cross-sectional views of some embodiments of a semiconductor structure for a mixed-signal IC device employing an etched recessed gate dielectric region at a particular stage of manufacture. More particularly, FIG. 12A illustrates the masking layer 1102 as employed in a mixed-signal IC device that includes a logic portion 1212 and a high-voltage portion 1214. The high-voltage portion 1214 includes the gate dielectric region 108 with the masking layer 1102 prior to being patterned (as shown in FIG. 11), while the logic portion 1212 may include logic circuitry (not explicitly shown in FIG. 12A) but also includes the masking layer 1102 prior to patterning. In some embodiments, the subsequent patterning of the masking layer 1102 in both the logic portion 1212 and the high-voltage portion 1214 is performed using a mask 1204.

In some embodiments, the mask 1204 may be created using mask data for a logic input/output (IO) positive resist mask (RM). More particularly, in some embodiments, the mask data may originally specify a first opening 1208 to pattern the masking layer 1102 in the logic portion 1212, as well as other openings associated with the logic portion 1212. In some embodiments, the first opening 1208 may be associated with a connect, via, or other conductive connection to be formed within the dielectric layer 114, such as for a transistor or other component for a logic function (e.g., a control function coupled to the high-voltage circuitry of the high-voltage portion 1214). Moreover, the mask data may be modified (e.g., by way of one or more logical operations) prior to creating the mask to include a second opening 1210 to pattern the masking layer 1102 over the gate dielectric region 108, as illustrated in FIG. 11.

FIG. 12B illustrates removal (e.g. etching, by way of etchant 1104) of the gate dielectric region 108 after patterning and removal of the portions of the masking layer 1102 associated with the first opening 1208 and the second opening 1210 of FIG. 12A. Consequently, in some embodiments, creation of the recess 110 in the gate dielectric region 108 may be performed concurrently with the creation of one or more voids or trenches in the logic portion 1212 of the mixed-signal IC device, thus resulting in a process integration in the fabrication of the IC device, thereby potentially reducing time and cost in such fabrication.

Figure 13:
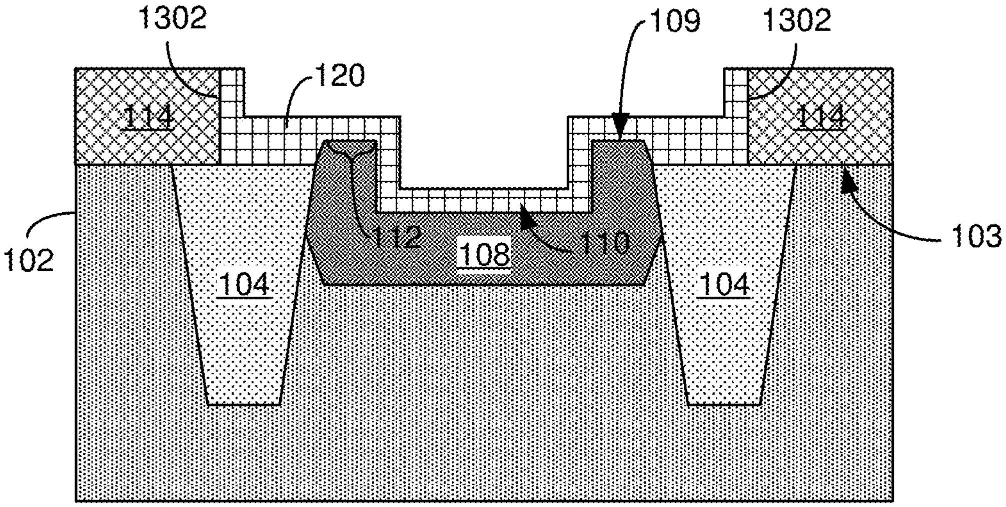

FIG. 13 illustrates forming (e.g., by conformal deposition) of the diffusion barrier 120 (e.g., tantalum nitride (TaN)) over the gate dielectric region 108. In some embodiments, the diffusion barrier 120 conformally contacts the recess 110 and perimeter portion 112 of the gate dielectric region 108, the one or more isolation regions 104, and possibly sidewalls 1302 of the dielectric layer 114 facing the gate dielectric region 108.

Figure 14:
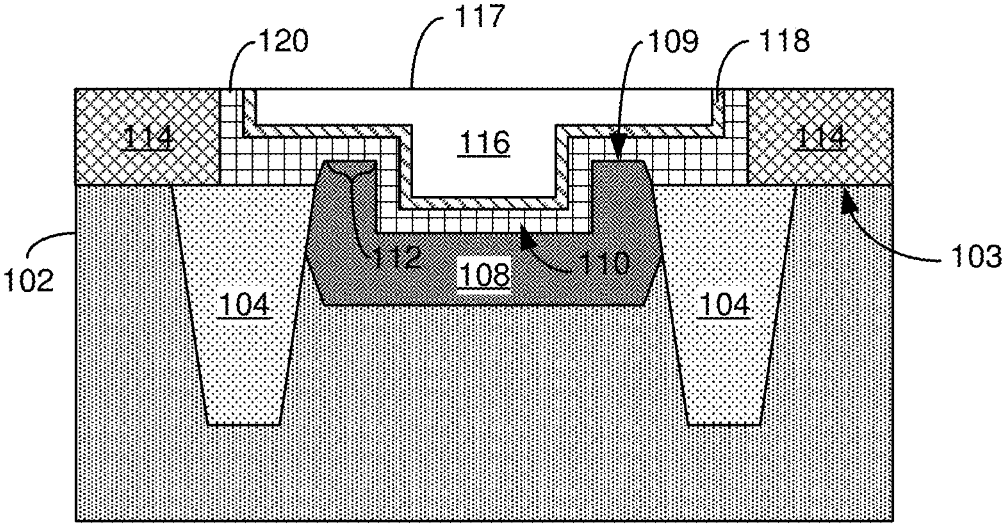

FIG. 14 illustrates forming (e.g., depositing) the gate structure 116 (e.g., polycrystalline silicon, metal, or other conductor) over the diffusion barrier 120. In some embodiments, the diffusion barrier 120 isolates the gate structure 116 from the gate dielectric region 108, as well as possibly from the at least one isolation region 104 and the dielectric layer 114. In some embodiments, the forming of the gate structure 116 may cause the formation of the transition layer 118 between the gate structure 116 and the diffusion barrier 120, which may include material from both the gate structure 116 and the diffusion barrier 120. Also, in some embodiments, a CMP process may be performed after the deposition of the gate structure 116 to planarize the upper surface provided by the gate structure 116, the diffusion barrier 120, and the dielectric layer 114, thus providing the upper planar surface 117 for the gate structure 116. Thereafter, in some embodiments, additional dielectric layers (e.g., dielectric layers (ILD1, ILD2, etc.) and associated metal layers (M1, M2, etc.) may be formed over the structure shown in FIG. 14.

Figure 15:
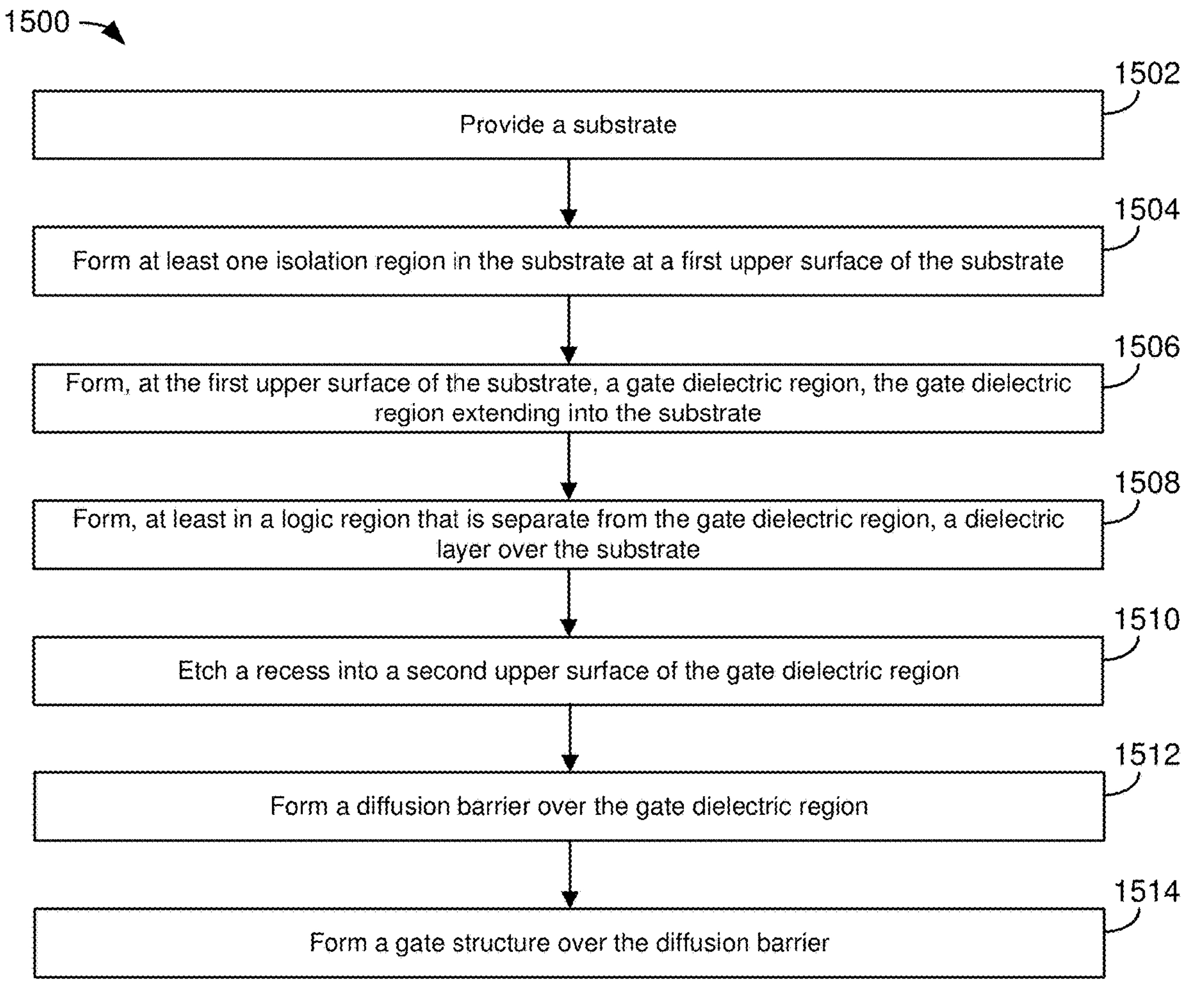
FIG. 15 illustrates a methodology of forming an IC device employing an etched recessed gate dielectric region in accordance with some embodiments.

FIG. 15 illustrates a methodology 1500 of forming an IC device with employing an etched recessed gate dielectric region in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Acts 1502 through 1514 may correspond, for example, to the structure previously illustrated in FIGS. 3 through 15 in some embodiments. At Act 1502, for example, a substrate (e.g., substrate 102 of FIG. 1) may be provided. FIG. 3 illustrates a cross-sectional view of some embodiments corresponding to Act 1502.

At Act 1504, at least one isolation region (e.g., at least one isolation region 104) may be formed in the substrate at a first upper surface (e.g., first upper surface 103 of FIG. 1) of the substrate. FIG. 4 illustrates a cross-sectional view of some embodiments corresponding to Act 1504.

At Act 1506, a gate dielectric region (e.g., gate dielectric region 108 of FIG. 1) is formed at the first upper surface of the substrate. FIGS. 5, 6, and 7 illustrate cross-sectional views of some embodiments corresponding to Act 1506.

At Act 1508, a dielectric layer (e.g., dielectric layer 114 of FIG. 1) is formed over the substrate at least in a logic region that is separate from the gate dielectric region. FIGS. 8, 9, 10, and 12A illustrate cross-sectional views of some embodiments corresponding to Act 1508.

At Act 1510, a recess (e.g., recess 110) is etched into a second upper surface (e.g., second upper surface 109 of FIG. 1) of the gate dielectric region. In some embodiments, the etching of the recess may occur concurrently with etching of the dielectric layer in the logic region by way of the same mask, as described above. FIGS. 12 and 12B illustrate cross-sectional views of some embodiments corresponding to Act 1510.

At Act 1512, a diffusion barrier (e.g., diffusion barrier 120) is formed over the gate dielectric region. FIG. 13 illustrates a cross-sectional view of some embodiments corresponding to Act 1512.

At Act 1514, a gate structure (e.g., gate structure 116) may be formed over the diffusion barrier. FIG. 14 illustrates a cross-sectional view of some embodiments corresponding to Act 1514.

Some embodiments relate to an integrated circuit device. The integrated circuit device includes a substrate having a first upper surface, a gate dielectric region disposed at the first upper surface of the substrate and extending into the substrate, and a gate structure disposed over the gate dielectric region. The gate dielectric region includes a second upper surface and a recess extending below the second upper surface. The second upper surface includes a perimeter portion surrounding the recess. The gate structure completely covers the second upper surface of the gate dielectric region and extends into the recess.

Some embodiments relate to another integrated circuit device. The integrated circuit device includes a substrate and a gate dielectric region disposed within the substrate and extending over an upper surface of the substrate. The gate dielectric region has one or more sidewalls that form a recess within an upper surface of the gate dielectric region. The integrated circuit device also includes a diffusion barrier that is disposed over the gate dielectric region, extends into the recess, and spans an entirety of the gate dielectric region. The integrated circuit device also includes a conductive gate material disposed over the diffusion barrier and extending into the recess. The diffusion barrier isolates the conductive gate material from the gate dielectric region. The integrated circuit device also includes a dielectric structure disposed over the substrate and positioned laterally of the diffusion barrier and the conductive gate material.

Some embodiments relate to a method of manufacturing an integrated circuit device. The method includes providing a substrate, and forming a gate dielectric region at a first upper surface of the substrate. The gate dielectric region extends into the substrate. The method also includes etching a recess into a second upper surface of the gate dielectric region. The second upper surface includes a perimeter portion surrounding the recess. The method also includes forming, over the gate dielectric region, a gate structure. The gate structure completely covers the second upper surface of the gate dielectric region and extends into the recess.

It will be appreciated that in this written description, as well as in the claims below, the terms “first”, “second”, “second”, “third” etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, “a first dielectric layer” described in connection with a first figure may not necessarily correspond to a “first dielectric layer” described in connection with another figure, and may not necessarily correspond to a “first dielectric layer” in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:

a substrate comprising a first upper surface;

an isolation region in the substrate and comprising first and second isolation segments spaced in a first direction;

a gate dielectric region disposed at the first upper surface of the substrate between the first and second isolation segments and extending into the substrate, the gate dielectric region comprising a second upper surface and a recess extending below the second upper surface, the second upper surface comprising a perimeter portion surrounding the recess; and a gate structure disposed over the gate dielectric region, the gate structure completely covering the second upper surface of the gate dielectric region and extending into the recess, wherein the gate structure comprises a diffusion barrier having a first lower surface in the recess, a second lower surface on the second upper surface, and a third lower surface on the isolation region.

2. The integrated circuit device of claim 1, wherein:

the gate structure comprises a gate electrode having an upper planar surface extending laterally beyond the gate dielectric region, a fourth lower surface in the recess, and a fifth lower surface extending from the first lower surface to the third lower surface in the first direction.

3. The integrated circuit device of claim 1, wherein the first lower surface is at a first depth below the substrate, the second lower surface is at a first height above the substrate, and the third lower surface of the diffusion barrier is at a second height between the first height and the first depth.

4. The integrated circuit device of claim 1, further comprising a first dielectric level with the gate structure that has sidewalls contacting the diffusion barrier and the isolation region.

5. The integrated circuit device of claim 4, wherein the gate structure extends over the isolation region, wherein the diffusion barrier has a first width at an elevation level with the first upper surface of the first dielectric, wherein the diffusion barrier has a second width measured between the first dielectric and the gate dielectric region at an elevation level with the gate dielectric region, and wherein the second width is greater than the first width.

6. The integrated circuit device of claim 4, wherein the diffusion barrier laterally separates the gate structure from the gate dielectric region and the isolation region at a first elevation below the first upper surface of the substrate.

7. The integrated circuit device of claim 1, further comprising a first dielectric on the first upper surface of the substrate, wherein the diffusion barrier further comprises:

a first sidewall in the recess and contacting the gate dielectric region;

a second sidewall facing towards the recess and contacting the gate dielectric region; and a third sidewall facing away from the recess, facing away from the gate dielectric region, and contacting the first dielectric.

8. The integrated circuit device of claim 7, wherein:

the gate dielectric region has a first thickness within a central region of the gate dielectric region and a second thickness within a peripheral region of the gate dielectric region, the first thickness being less than the second thickness.

9. The integrated circuit device of claim 1, wherein:

the recess has a rectangular shape in a plan view of the gate dielectric region; and the perimeter portion includes a rectangular border comprising four linear segments, each of the four linear segments having the same width.

10. The integrated circuit device of claim 1, wherein:

a thickness of the perimeter portion of the gate dielectric region is positively related to a maximum expected gate voltage across the gate dielectric region.

11. The integrated circuit device of claim 1, wherein:

the recess extends downward into the gate dielectric region below the first upper surface of the substrate.

12. An integrated circuit device, comprising:

a substrate;

a gate dielectric region disposed within the substrate and extending over an upper surface of the substrate, the gate dielectric region comprising one or more sidewalls that form a recess within an upper surface of the gate dielectric region and outer sidewalls facing away from the recess;

a diffusion barrier disposed over the gate dielectric region, extending into the recess, and spanning an entirety of the gate dielectric region;

a conductive gate material disposed over the diffusion barrier and extending into the recess, the diffusion barrier isolating the conductive gate material from the gate dielectric region, the conductive gate material comprising:

a first lower surface within the recess and between the one or more sidewalls of the gate dielectric region, and a second lower surface extending from an inner edge directly over the recess and laterally between the one or more sidewalls to an outer edge extending past the outer sidewalls of the gate dielectric region; and a dielectric structure disposed over the substrate and positioned laterally of the diffusion barrier and the conductive gate material.

13. The integrated circuit device of claim 12, further comprising:

at least one isolation region disposed in the substrate proximate the gate dielectric region.

14. The integrated circuit device of claim 13, wherein:

the conductive gate material and the diffusion barrier extend from over a top of the gate dielectric region to directly between the sidewalls of the gate dielectric region, and wherein the outer edge of the second lower surface of the conductive gate material extends directly over the at least one isolation region.

15. A method, comprising:

providing a substrate;

forming a gate dielectric region at a first upper surface of the substrate, the gate dielectric region extending into the substrate and having a first thickness measured from a second upper surface of the gate dielectric region extending over the first upper surface of the substrate to a lower surface of the gate dielectric region extending beneath the first upper surface of the substrate;

etching a recess into the second upper surface of the gate dielectric region, thereby removing material from a portion of the gate dielectric region extending from over the first upper surface of the substrate to a depth beneath the second upper surface that is over half of the first thickness and less than the first thickness, wherein the second upper surface comprises a perimeter portion surrounding the recess; and forming, over the gate dielectric region, a gate structure, the gate structure completely covering the second upper surface of the gate dielectric region and extending into the recess.

16. The method of claim 15, further comprising:

forming at least one isolation region in the substrate at the first upper surface before forming the gate dielectric region, the gate dielectric region being formed and an interface between the substrate and the at least one isolation region.

17. The method of claim 16, further comprising:

forming a barrier structure covering an upper surface of the isolation region and portions of the substrate before forming the gate dielectric region in the substrate; and removing the barrier structure before etching the recess into the gate dielectric region.

18. The method of claim 16, further comprising:

forming a diffusion barrier over the gate dielectric region before forming the gate structure, the diffusion barrier isolating the gate structure from the gate dielectric region and being formed on the isolation region, the second upper surface of the gate dielectric region, and a third upper surface of the gate dielectric region exposed by the etching of the gate dielectric region.

19. The method of claim 15, further comprising:

forming a dielectric layer over the substrate at least in a logic region of the substrate that is separate from the gate dielectric region; and etching the dielectric layer using a mask after forming the dielectric layer, wherein etching the recess is performed using the mask.

20. The method of claim 19, wherein:

etching the dielectric layer and etching the recess are performed concurrently.

* * * * *